(12) United States Patent
Hsu et al.

(10) Patent No.: US 10,134,878 B2
(45) Date of Patent: Nov. 20, 2018

(54) OXYGEN VACANCY OF IGZO PASSIVATION BY FLUORINE TREATMENT

(71) Applicant: Applied Materials, Inc., Santa Clara, CA (US)

(72) Inventors: Hao-Chien Hsu, San Jose, CA (US); Dong-Kil Yim, Pleasanton, CA (US); Tae Kyung Won, San Jose, CA (US); Xuena Zhang, San Jose, CA (US); Won Ho Sung, Asan-si (KR); Rodney Shunleong Lim, Daly City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/359,325

(22) Filed: Nov. 22, 2016

(65) Prior Publication Data
US 2017/0207327 A1    Jul. 20, 2017

Related U.S. Application Data

(60) Provisional application No. 62/278,955, filed on Jan. 14, 2016.

(51) Int. Cl.
*H01L 29/786* (2006.01)
*H01L 29/66* (2006.01)
*H01L 21/02* (2006.01)

(52) U.S. Cl.
CPC .. *H01L 29/66969* (2013.01); *H01L 21/02554* (2013.01); *H01L 21/02565* (2013.01); *H01L 21/02631* (2013.01); *H01L 21/02664* (2013.01); *H01L 29/7869* (2013.01); *H01L 21/02576* (2013.01); *H01L 21/02579* (2013.01); *H01L 21/02581* (2013.01)

(58) Field of Classification Search
None
See application file for complete search history.

(56) References Cited

U.S. PATENT DOCUMENTS

| | | | |
|---|---|---|---|
| 6,235,559 B1 | 5/2001 | Kuo | |
| 8,906,813 B2 | 12/2014 | Won et al. | |
| 9,123,707 B2 | 9/2015 | Choi | |
| 2005/0145850 A1 | 7/2005 | Dennison et al. | |
| 2008/0076268 A1 | 3/2008 | Kraus et al. | |
| 2013/0313657 A1 | 11/2013 | Tong | |
| 2014/0091379 A1* | 4/2014 | Tang | H01L 27/14621 257/294 |

(Continued)

FOREIGN PATENT DOCUMENTS

JP    2013-041949 A    2/2013

OTHER PUBLICATIONS

International Search Report and Written Opinion dated Apr. 21, 2017 for Application No. PCT/US2017/012872.

*Primary Examiner* — Bradley K Smith
(74) *Attorney, Agent, or Firm* — Patterson + Sheridan LLP (57) ABSTRACT

Embodiments of the present disclosure generally relate to methods for forming a TFT having a metal oxide layer. The method may include forming a metal oxide layer and treating the metal oxide layer with a fluorine containing gas or plasma. The fluorine treatment of the metal oxide layer helps fill the oxygen vacancies in the metal oxide channel layer, leading to a more stable TFT and preventing a negative threshold voltage in the TFT.

20 Claims, 10 Drawing Sheets

(56) References Cited

U.S. PATENT DOCUMENTS

| | | | |
|---|---|---|---|
| 2015/0140836 A1* | 5/2015 | Niyogi | H01L 21/3105 438/779 |
| 2015/0380561 A1 | 12/2015 | Won et al. | |
| 2016/0155849 A1* | 6/2016 | Noda | H01L 29/7869 257/43 |
| 2016/0343878 A1* | 11/2016 | Kwon | H01L 29/247 |
| 2017/0323903 A1* | 11/2017 | Wang | H01L 27/127 |

* cited by examiner

OXYGEN VACANCY OF IGZO PASSIVATION BY FLUORINE TREATMENT

CLAIM OF PRIORITY UNDER 35 U.S.C. 119

This application claims priority to U.S. Provisional Patent Application Ser. No. 62/278,955, filed on Jan. 14, 2016, which herein is incorporated by reference.

BACKGROUND

Field

Embodiments of the present disclosure generally relate to methods for forming a thin film transistor (TFT), and more specifically to methods for forming a TFT having a metal oxide layer.

Description of the Related Art

Metal oxide semiconductors, such as zinc oxide (ZnO) and indium gallium zinc oxide (IGZO) are attractive for device fabrication due to their high carrier mobility, low processing temperatures, and optical transparency. TFTs made from metal oxide semiconductors (MO-TFTs) are particularly useful in active-matrix addressing schemes for optical displays. The low processing temperature of metal oxide semiconductors allows the formation of display backplanes on inexpensive plastic substrates such as polyethylene terephthalate (PET) and polyethylene naphthalate (PEN). The transparency of oxide semiconductor TFTs leads to improved pixel apertures and brighter displays.

However, a metal oxide layer, such as a metal oxide channel layer, is susceptible to the formation of oxygen vacancies in the layer, and the formation of oxygen vacancies lead to unstable TFTs. In addition, the formation of oxygen vacancies also causes a negative threshold voltage, since oxygen vacancies are donors in metal oxide materials.

Therefore, there is a need in the art for forming stable metal oxide TFTs.

SUMMARY

Embodiments of the present disclosure generally relate to methods for forming a TFT having a metal oxide layer. The method may include forming a metal oxide layer and treating the metal oxide layer with a fluorine containing gas or plasma. The fluorine treatment of the metal oxide layer fills any oxygen vacancies in the metal oxide channel layer, leading to a more stable TFT and preventing a negative threshold voltage in the TFT.

In one embodiment, a method includes forming a gate electrode over a substrate, depositing a gate dielectric layer over the gate electrode, depositing a metal oxide layer over the gate dielectric layer, generating a first remote plasma, treating the metal oxide layer with first fluorine radicals, and depositing a conductive layer over the metal oxide layer.

In another embodiment, a method includes depositing a metal oxide layer over a substrate, treating the metal oxide layer with first fluorine radicals or a first fluorine containing gas, depositing a gate dielectric layer on the metal oxide layer, depositing an inter-layer dielectric layer over the metal oxide layer, and depositing a metal layer on the inter-layer dielectric layer.

In another embodiment, a method includes forming a gate electrode over a substrate, depositing a gate dielectric layer over the gate electrode, depositing a metal oxide layer over the gate dielectric layer, treating the metal oxide layer with a fluorine containing gas, and depositing a conductive layer over the metal oxide layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally relate to methods for forming a TFT having a metal oxide layer. The method may include forming a metal oxide layer and treating the metal oxide layer with a fluorine containing gas or plasma. The fluorine treatment of the metal oxide layer helps fill the oxygen vacancies in the metal oxide channel layer, leading to a more stable TFT and preventing a negative threshold voltage in the TFT.

Figure 1:
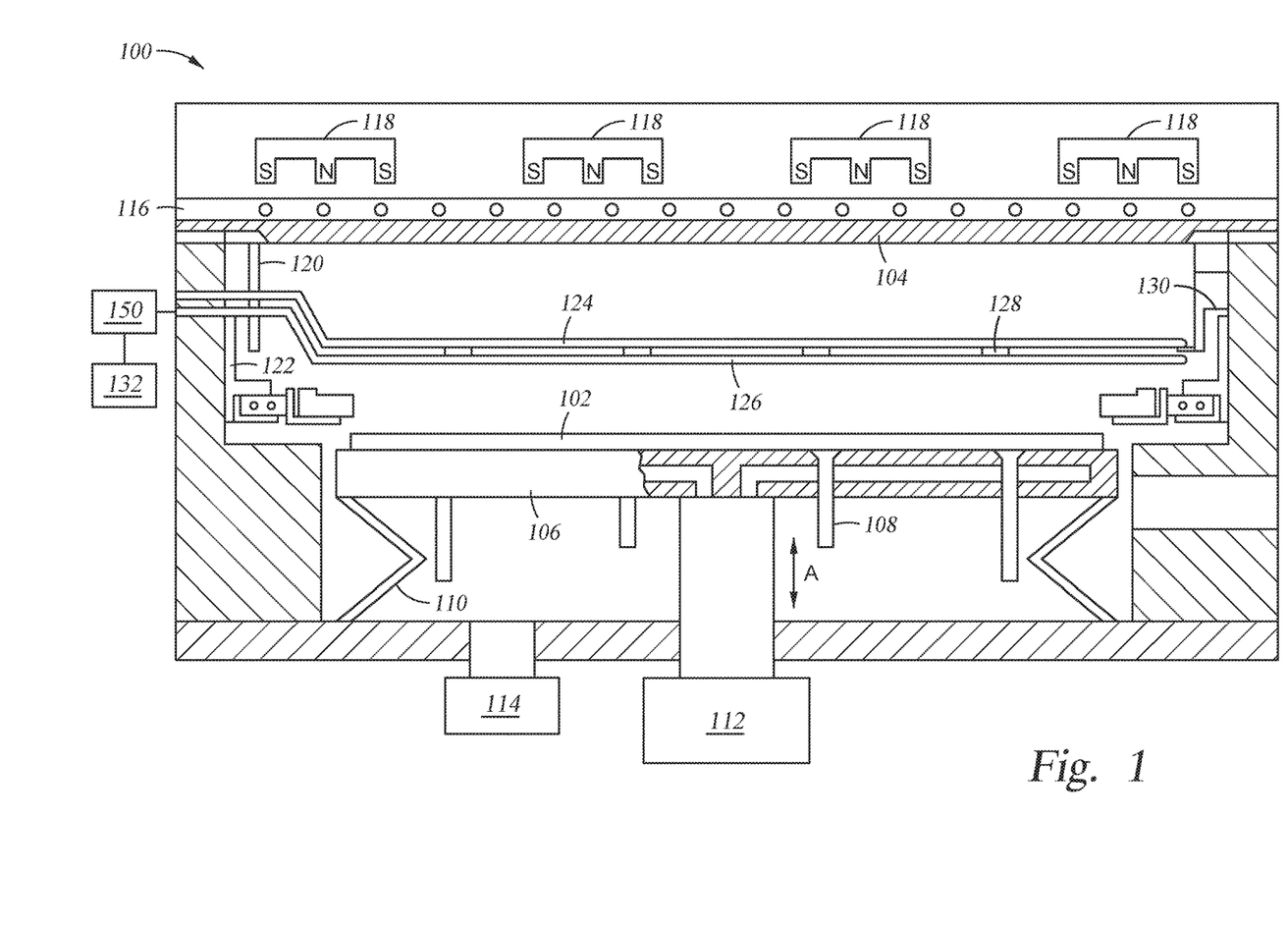
FIG. 1 is a cross sectional schematic view of a physical vapor deposition chamber according to embodiments disclosed herein.

FIG. 1 is a cross sectional schematic view of a physical vapor deposition (PVD) chamber 100 according to embodiments disclosed herein. The chamber 100 may be evacuated by a vacuum pump 114. Within the chamber 100, a substrate 102 may be disposed opposite a target 104. The substrate 102 may be disposed on a susceptor 106 within the chamber 100. The susceptor 106 may be elevated and lowered as shown by arrows "A" by an actuator 112. The susceptor 106 may be elevated to raise the substrate 102 to a processing position and lowered so that the substrate 102 may be removed from the chamber 100. Lift pins 108 elevate the substrate 102 above the susceptor 106 when the susceptor 106 is in the lowered position. Grounding straps 110 may ground the susceptor 106 during processing. The susceptor 106 may be raised during processing to aid in uniform deposition.

The target 104 may include one or more targets. In one embodiment, the target 104 may be a large area sputtering target. In another embodiment, the target 104 may be a plurality of tiles. In yet another embodiment, the target 104 may be a plurality of target strips. In still another embodiment, the target 104 may be one or more cylindrical, rotary targets. The target 104 may be bonded to a backing plate 116 by a bonding layer (not shown). One or more magnetrons 118 may be disposed over the backing plate 116. The magnetrons 118 may scan across the backing plate 116 in a linear movement or in a two dimensional path. The walls of the chamber may be shielded from deposition by a dark space shield 120 and a chamber shield 122.

To help provide uniform sputtering deposition across a substrate 102, an anode 124 may be placed between the target 104 and the substrate 102. In one embodiment, the anode 124 may be bead blasted stainless steel coated with arc sprayed aluminum. In one embodiment, one end of the anode 124 may be mounted to the chamber wall by a bracket 130. The anode 124 provides a charge in opposition to the target 104 so that charged ions will be attracted thereto rather than to the chamber walls which are typically at ground potential. By providing the anode 124 between the target 104 and the substrate 102, the plasma may be more uniform, which may aid the deposition. To reduce flaking, a cooling fluid may be provided through the one or more anodes 124. By reducing the amount of expansion and contraction of the anodes 124, flaking of material from the anodes 124 may be reduced. For smaller substrates and hence, smaller processing chambers, the anodes 124 spanning the processing space may not be necessary as the chamber walls may be sufficient to provide a path to ground and a uniform plasma distribution.

For reactive sputtering, it may be beneficial to provide a reactive gas into the chamber 100. One or more gas introduction tubes 126 may also span the distance across the chamber 100 between the target 104 and the substrate 102. For smaller substrates and hence, smaller chambers, the gas introduction tubes 126 spanning the processing space may not be necessary as an even gas distribution may be possible through conventional gas introduction means. The gas introduction tubes 126 may introduce sputtering gases from a gas panel 132. In some embodiments, a remote plasma source 150 may be coupled between the gas panel 132 and the gas introduction tubes 126, and the gas introduction tubes 126 may be used to introduce a remote plasma produced by the remote plasma source 150 into the chamber 100. The gas introduction tubes 126 may be coupled with the anodes 124 by one or more couplings 128. The coupling 128 may be made of thermally conductive material to permit the gas introduction tubes 126 to be conductively cooled. Additionally, the coupling 128 may be electrically conductive as well so that the gas introduction tubes 126 are grounded and function as anodes.

The reactive sputtering process may include disposing a zinc sputtering target opposite a substrate in the PVD chamber 100. The zinc sputtering target may substantially include zinc or zinc and a doping element. Suitable dopants that may be used include Al, Sn, Ga, Ca, Si, Ti, Cu, Ge, In, Ni, Mn, Cr, V, Mg, $Si_xN_y$, $Al_xO_y$, and SiC. In one embodiment, the dopant includes aluminum. The substrate, on the other hand, may be plastic, paper, polymer, glass, stainless steel, and combinations thereof. When the substrate is plastic, the reactive sputtering may occur at temperatures below about 180 degrees Celsius.

During the sputtering process, argon, a nitrogen containing gas, and an oxygen containing gas may be provided to the chamber for reactive sputtering the zinc target. Additional additives such as $B_2H_6$, $CO_2$, CO, $CH_4$, and combinations thereof may also be provided to the chamber during the sputtering. In one embodiment, the nitrogen containing gas comprises $N_2$. In another embodiment, the nitrogen containing gas comprises $N_2O$, $NH_3$, or combinations thereof. In one embodiment, the oxygen containing gas comprises $O_2$. In another embodiment, the oxygen containing gas comprises $N_2O$. The nitrogen of the nitrogen containing gas and the oxygen of the oxygen containing gas react with the zinc from the sputtering target to form a metal oxide layer including zinc, oxygen, and nitrogen on the substrate. In one embodiment, the metal oxide layer is an IGZO layer.

After the formation of the metal oxide layer, the metal oxide layer may be treated by a fluorine containing gas or plasma in the PVD chamber 100. The fluorine containing gas may be introduced to the PVD chamber 100 by the gas panel 132. The fluorine containing gas may include any suitable fluorine containing gas, such as $NF_3$, $CF_4$ or $F_2$. The fluorine containing plasma may be a remote plasma introduced to the PVD chamber 100 by the remote plasma source 150. The fluorine containing gas, such as $NF_3$, $CF_4$, $F_2$ or any suitable fluorine containing gas may be flowed into the remote plasma source 150 from the gas panel 132, and may be excited to form a fluorine containing plasma having fluorine radicals. The fluorine containing plasma may be used to treat the metal oxide layer via the gas introduction tubes 126.

Figure 2:
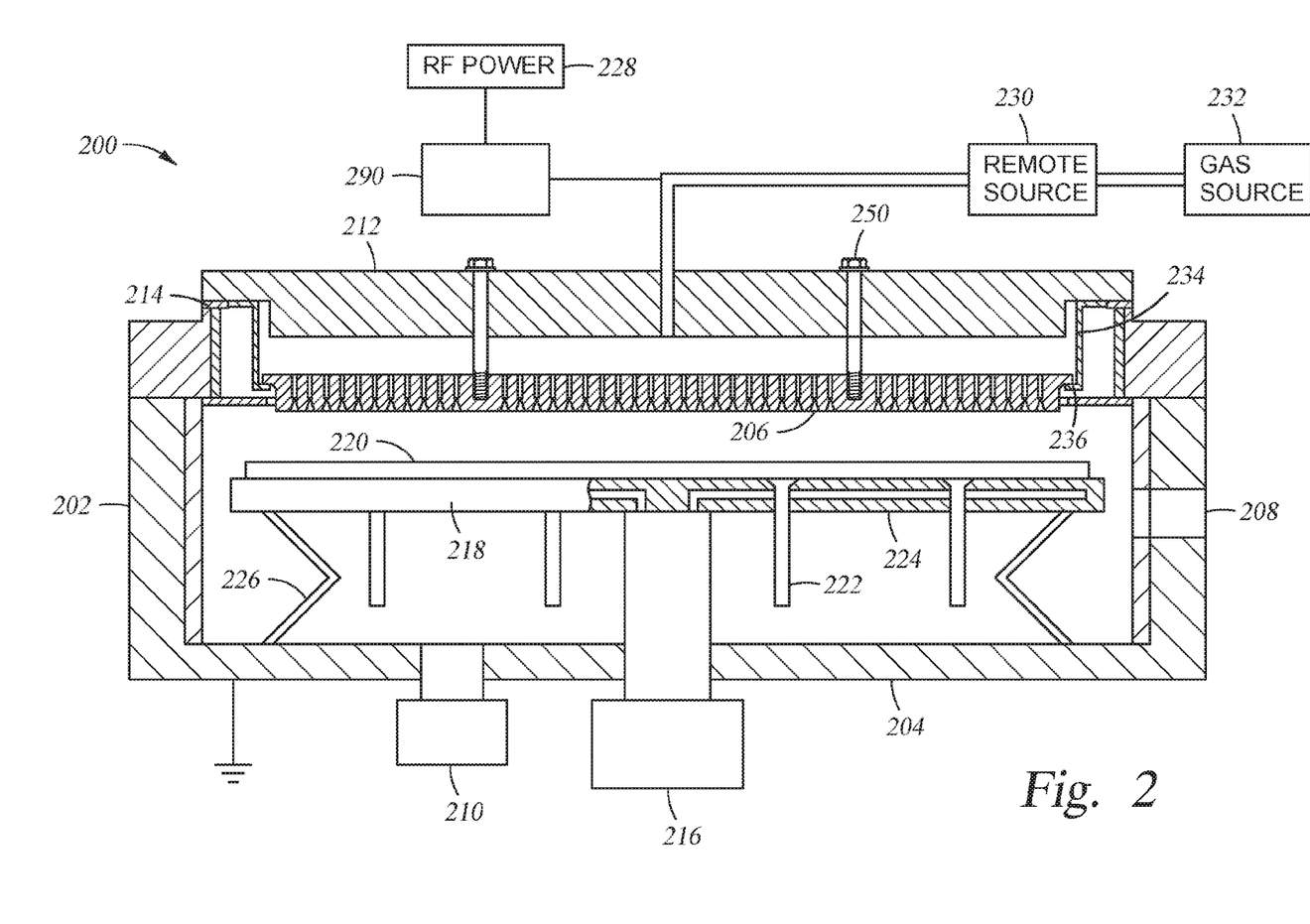
FIG. 2 is a cross sectional schematic view of a plasma enhanced chemical vapor deposition chamber according to embodiments disclosed herein.

FIG. 2 is a cross sectional schematic view of a plasma enhanced chemical vapor deposition (PECVD) chamber 200 according to embodiments disclosed herein. The PECVD chamber 200 generally includes walls 202, a bottom 204 and a showerhead 206 which define a process volume. A substrate support 218 is disposed within the process volume. The process volume is accessed through a slit valve opening 208 such that the substrate 220 may be transferred in and out of the PECVD chamber 200. The substrate support 218 may be coupled to an actuator 216 to raise and lower the substrate support 218. Lift pins 222 are moveably disposed through the substrate support 218 to move the substrate 220 to and from the substrate receiving surface of the substrate support 218. The substrate support 218 may also include heating and/or cooling elements 224 to maintain the substrate support 218 at a predetermined temperature. The substrate support 218 may also include RF return straps 226 to provide an RF return path at the periphery of the substrate support 218.

The showerhead 206 is coupled to a backing plate 212 by a fastening mechanism 250. The showerhead 206 may be coupled to the backing plate 212 by one or more fastening mechanisms 250 to help prevent sag and/or control the straightness/curvature of the showerhead 206.

A gas source 232 is coupled to the backing plate 212 to provide gas through gas passages in the showerhead 206 to a processing area between the showerhead 206 and the substrate 220. A vacuum pump 210 is coupled to the PECVD chamber 200 to control the process volume at a predetermined pressure. An RF source 228 is coupled through a match network 290 to the backing plate 212 and/or to the showerhead 206 to provide an RF current to the showerhead 206. The RF current creates an electric field between the showerhead 206 and the substrate support 218 so that a plasma may be generated from the gases between the showerhead 206 and the substrate support 218. In one embodiment, a fluorine containing gas is provided to the processing area by the gas source 232, and the fluorine containing gas may be used to treat a metal oxide layer on the substrate 220. In another embodiment, the fluorine containing gas may be excited by the RF source 228 provided to the showerhead 206 to form a fluorine containing plasma in the processing area, and the fluorine radicals may be used to treat a metal oxide layer on the substrate 220.

A remote plasma source 230, such as an inductively coupled remote plasma source 230, may also be coupled between the gas source 232 and the backing plate 212. Between processing substrates, a cleaning gas may be provided to the remote plasma source 230 so that a remote plasma is generated. The radicals from the remote plasma may be provided to the PECVD chamber 200 to clean PECVD chamber 200 components. The cleaning gas may be further excited by the RF source 228 provided to the showerhead 206. In some embodiment, the remote plasma source 230 may be used to excite a fluorine containing gas to form a fluorine containing plasma, and the remotely formed fluorine containing plasma may enter the processing area via the showerhead 206. The fluorine radicals in the remotely formed fluorine containing plasma may be used to treat a metal oxide layer on the substrate 220.

The showerhead 206 may additionally be coupled to the backing plate 212 by showerhead suspension 234. In one embodiment, the showerhead suspension 234 is a flexible metal skirt. The showerhead suspension 234 may have a lip 236 upon which the showerhead 206 may rest. The backing plate 212 may rest on an upper surface of a ledge 214 coupled with the walls 202 to seal the PECVD chamber 200.

FIGS. 3A-3G are cross sectional schematic views of a TFT 300 at various stages of fabrication according to embodiments disclosed herein. The TFT 300 may include a substrate 302. In one embodiment, the substrate 302 may be glass. In another embodiment, the substrate 302 may be a polymer. In another embodiment, the substrate 302 may be plastic. In still another embodiment, the substrate 302 may be a metal, such as a stainless steel sheet.

Figure 3A:
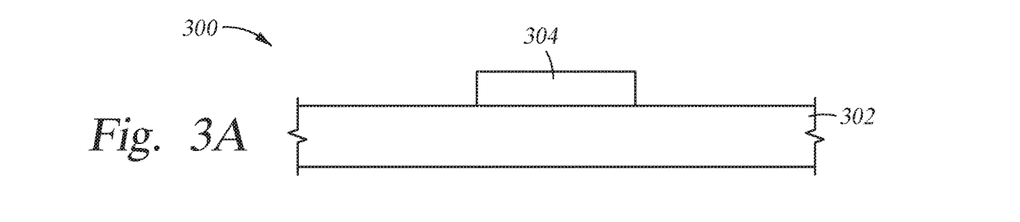
FIGS. 3A-3G are cross sectional schematic views of a TFT at various stages of fabrication according to embodiments disclosed herein.

Over the substrate, a gate electrode 304 may be formed. A thermal oxide layer may be between the gate electrode 304 and the substrate 302. The gate electrode 304 may be an electrically conductive layer that controls the movement of charge carriers within the TFT 300. The gate electrode 304 may be made of a metal such as aluminum, molybdenum, tungsten, chromium, tantalum, or combinations thereof. The gate electrode 304 may be formed using conventional deposition techniques including sputtering, lithography, and etching. The gate electrode 304 may be formed by blanket depositing a conductive layer over the substrate 302. The conductive layer may be deposited by sputtering. Thereafter, a photoresist layer may be deposited over the conductive layer. The photoresist layer may be patterned to form a mask. The gate electrode 304 may be formed by etching away the unmasked portions of the conductive layer to leave the gate electrode 304 over the substrate 302.

Figure 3B:
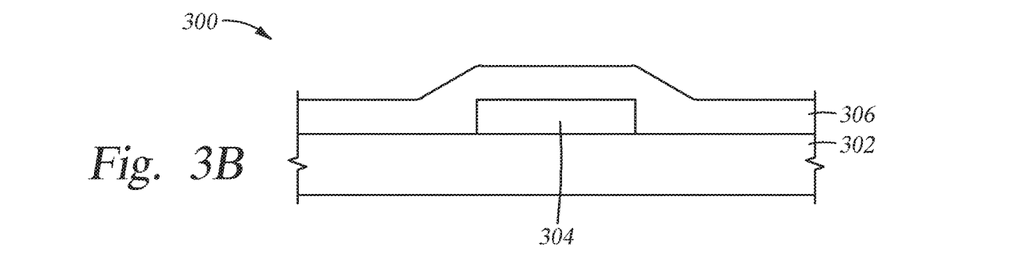

Over the gate electrode 304, a gate dielectric layer 306 may be deposited, as shown in FIG. 3B. The gate dielectric layer 306 may be deposited directly on the gate electrode 304. The gate dielectric layer 306 affects the sub threshold swing or slope and the threshold voltage ($V_{th}$) of the TFT 300. For silicon based TFTs (i.e., TFTs having a silicon based semiconductor layer such as amorphous silicon), the gate dielectric layer 306 cannot include silicon oxide because $V_{th}$ is far away from zero volts of the gate voltage which causes the TFT to perform poorly. However, for metal oxide TFTs, it has been discovered that silicon oxide may function as an effective gate dielectric layer 306. The oxygen in the silicon oxide may not detrimentally alter the metal oxide layer and thus, the TFT may not fail. In one embodiment, the gate dielectric layer 306 may include silicon nitride. In another embodiment, the gate dielectric layer 306 may include silicon oxide. In another embodiment, the gate dielectric layer 306 may include silicon oxynitride. In another embodiment, the gate dielectric layer 306 may include $Al_2O_3$. The gate dielectric layer 306 may be deposited by well-known deposition techniques including PECVD. In one embodiment, the gate dielectric layer 306 may be deposited by PVD.

Figure 3C:
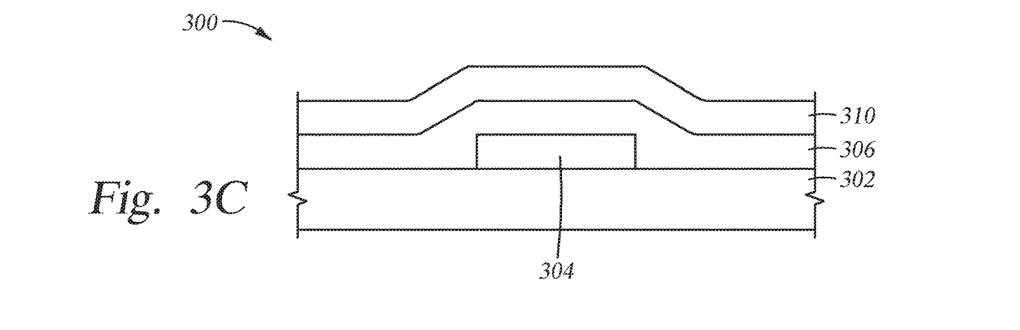

As shown in FIG. 3C, a metal oxide layer 310 may be deposited on and in direct contact with the gate dielectric layer 306. The metal oxide layer 310 may be the active channel in the final TFT structure. The metal oxide layer 310 may include oxygen, nitrogen, and one or more elements selected from the group consisting of zinc, gallium, cadmium, indium, tin, and combinations thereof. In one embodiment, the metal oxide layer 310 may include ZnO. In one embodiment, the metal oxide layer 310 is IGZO. The metal oxide layer 310 may be deposited by sputtering using the PVD chamber 100 shown in FIG. 1.

After the metal oxide layer 310 is deposited, an annealing process may be performed on the metal oxide layer 310. The annealing process may be performed in the chamber in which the metal oxide layer 310 is deposited. The annealing process may include maintaining the temperature of the substrate on which the metal oxide layer 310 is disposed at about 350 degrees Celsius for about one hour while flowing air across the surface of the substrate. Either prior to or after the annealing process, oxygen may leave the metal oxide layer 310, forming oxygen vacancies. In order to fill the oxygen vacancies and/or prevent oxygen from leaving the metal oxide layer 310, the metal oxide layer 310 may be treated by a fluorine containing gas or plasma.

Figure 3D:
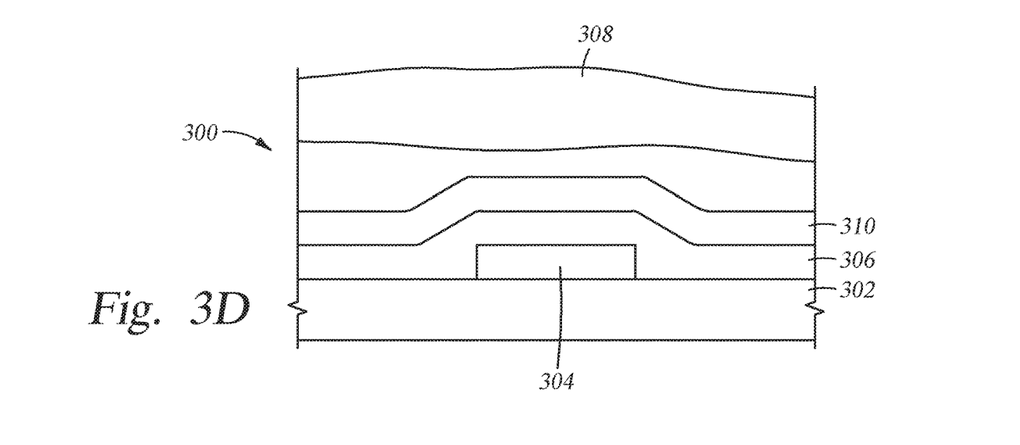

The treating of the metal oxide layer 310 may include exposing the metal oxide layer 310 to a fluorine containing gas or plasma 308, as shown in FIG. 3D. The fluorine gas molecules from the fluorine containing gas or fluorine radicals from the fluorine containing plasma may fill the oxygen vacancies and may passivate the metal oxide layer 310 to prevent oxygen molecules from leaving the metal oxide layer 310. The treatment process of the metal oxide layer 310 does not form a layer of material on the surface of the metal oxide layer 310. The treatment process may include diffusing the fluorine gas molecules or fluorine radicals into the metal oxide layer 310. In one embodiment, the metal oxide layer 310 may be exposed to a fluorine containing gas such as $NF_3$, $CF_4$, $F_2$ or any suitable fluorine containing gas. The fluorine containing gas may be oxygen free or silicon free. In another embodiment, the metal oxide layer 310 may be exposed to a plasma including fluorine radicals. The fluorine containing plasma may be formed remotely or in situ. The fluorine containing plasma may be formed by flowing a fluorine containing gas, such as $NF_3$, $CF_4$, $F_2$ or any suitable fluorine containing gas, into a remote plasma source or a process chamber in which the metal oxide layer 310 is disposed. The fluorine containing gas is then excited by an RF power and a fluorine containing plasma is formed outside of the process chamber (i.e., remotely) or inside of the process chamber (i.e., in situ). The fluorine containing plasma may be oxygen free or silicon free.

The treatment time of the metal oxide layer 310 by the fluorine containing gas or plasma, i.e., the time the metal oxide layer 310 is exposed to the fluorine containing gas or fluorine containing plasma, may range from about 10 s to about 100 s, such as from about 20 s to about 60 s. The treating of the metal oxide layer 310 may be performed in the chamber in which the metal oxide layer 310 is deposited, such as the PVD chamber 100 shown in FIG. 1. Alternatively, the treating of the metal oxide layer 310 may be performed in a chamber in which subsequent layer is deposited, such as the PECVD chamber 200 shown in FIG. 2. In one embodiment, the metal oxide layer 310 is treated in a PECVD chamber similar to the PECVD chamber 200 using a remote plasma. In this embodiment, NF$_3$ and Ar gases are flowed to the remote plasma source, such as the remote plasma source 230. The NF$_3$ gas may have a flow rate ranging from about 2000 standard cubic centimeters per minute (sccm) to about 6000 sccm, and the Ar gas may have a flow rate ranging from about 2000 sccm to about 6000 sccm. In one embodiment, the NF$_3$ gas flow rate and the Ar gas flow rate are both 4000 sccm. The remote plasma source may have a power density ranging from about 0.2 W/cm$^2$ to about 0.6 W/cm$^2$, such as about 0.4 W/cm$^2$. The pressure inside the PECVD chamber may range from about 200 mT to about 900 mT, such as from about 500 mT to about 600 mT. The substrate on which the metal oxide layer 310 is disposed may be heated to a temperature ranging from about 150 degrees Celsius to about 350 degrees Celsius, such as from about 220 degrees Celsius to about 240 degrees Celsius.

Figure 3E:
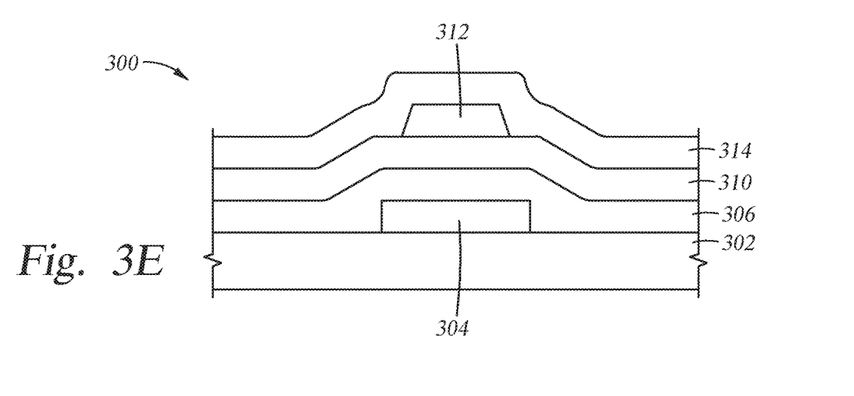

Next, as shown in FIG. 3E, an etch stop layer 312 may be deposited on the fluorine treated metal oxide layer 310, and the etch stop layer 312 may be patterned to cover a portion of the metal oxide layer 310. The etch stop layer 312 may be made of a dielectric material, such as silicon oxide, aluminum oxide, silicon nitride, or other suitable material. The etch stop layer 312 may be deposited in a PVD chamber, such as the PVD chamber 100 shown in FIG. 1, or in a PECVD chamber, such as the PECVD chamber 200 shown in FIG. 2. A conductive layer 314 may be deposited on the etch stop layer 312 and the treated metal oxide layer 310, as shown in FIG. 3E. The conductive layer 314 may be made of an electrically conductive metal such as aluminum, tungsten, molybdenum, chromium, tantalum, and combinations thereof. The conductive layer 314 may be deposited by PVD.

Figure 3F:
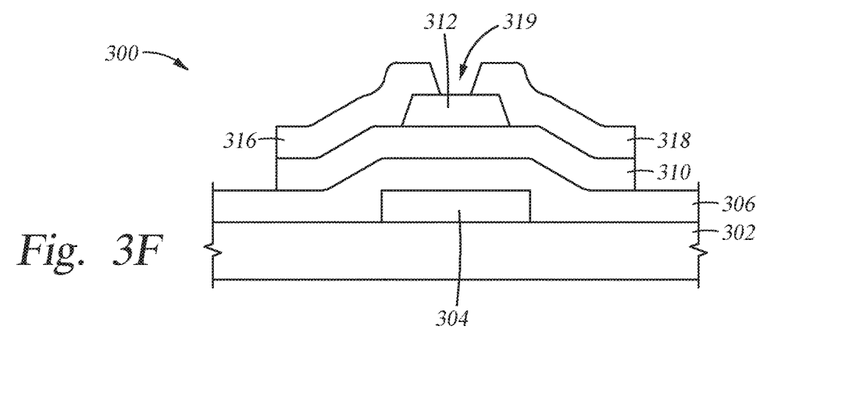

After the conductive layer 314 is deposited, the source electrode 316, the drain electrode 318, and the active channel 319 may be defined by etching away portions of the conductive layer 314, as shown in FIG. 3F. Portions of the fluorine treated metal oxide layer 310 may also be removed by etching, exposing portions of the gate dielectric layer 306. The etch stop layer 312 functions to protect the active channel 319 from undue plasma exposure during etching.

Figure 3G:
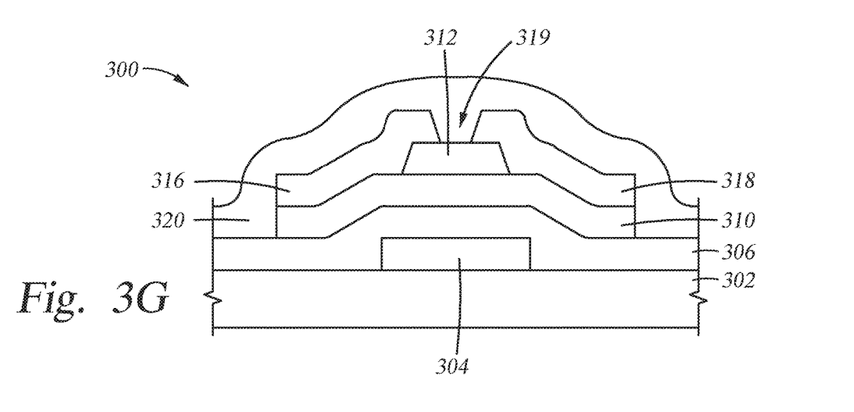

Next, as shown in FIG. 3G, a passivation layer 320 is deposited on the exposed portions of the gate dielectric layer 306 and the source electrode 316, the drain electrode 318, and the passivation layer 320 is also deposited in the active channel 319. The passivation layer 320 may include silicon oxide, silicon oxynitride, silicon carbide, amorphous carbon, or any other suitable material. The TFT 300 may be a bottom gate TFT. The fluorine containing gas or plasma treatment may be performed on a metal oxide layer in any suitable TFT. In some embodiments, the fluorine containing gas or plasma treatment is performed on a metal oxide layer of a top gate TFT.

Figure 4A:
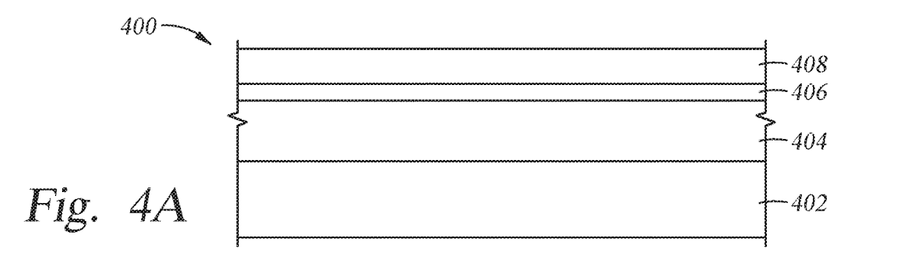
FIGS. 4A-4F are cross sectional schematic views of a TFT at various stages of fabrication according to embodiments disclosed herein.
Figure 4B:
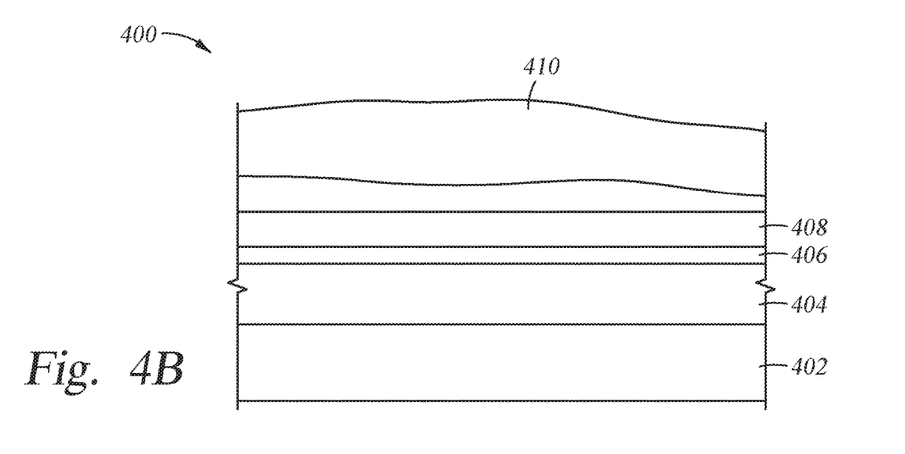

FIGS. 4A-4F are cross sectional schematic views of a TFT 400 at various stages of fabrication according to embodiments disclosed herein. The TFT 400 may be a top gate TFT and may include a substrate 402. The substrate 402 may be made of the same material as the substrate 302. A thermal oxide layer 404 may be formed on the substrate 402, and the thermal oxide layer 404 may be in direct contact with the substrate 402. A silicon oxide layer 406 may be formed on the thermal oxide layer 404, and the silicon oxide layer 406 may be in direct contact with the thermal oxide layer 404. A metal oxide layer 408 may be deposited over the substrate 402, such as on and in direct contact with the silicon oxide layer 406. The metal oxide layer 408 may be the active channel in the final TFT structure. The metal oxide layer 408 may be made of the same material as the metal oxide layer 310, and may be deposited by the same process used to deposit the metal oxide layer 310. After the metal oxide layer 408 is deposited, in order to fill the oxygen vacancies and/or prevent oxygen from leaving the metal oxide layer 408, the metal oxide layer 408 may be treated by a fluorine containing gas or plasma. The fluorine gas or plasma treatment of the metal oxide layer 408 may be the same as fluorine gas or plasma treatment of the metal oxide layer 310, such as exposing the metal oxide layer 408 to a fluorine containing gas or plasma 410, as shown in FIG. 4B. The fluorine containing gas or plasma 410 may be the same as the fluorine containing gas or plasma 308 shown in FIG. 3D.

Figure 4C:
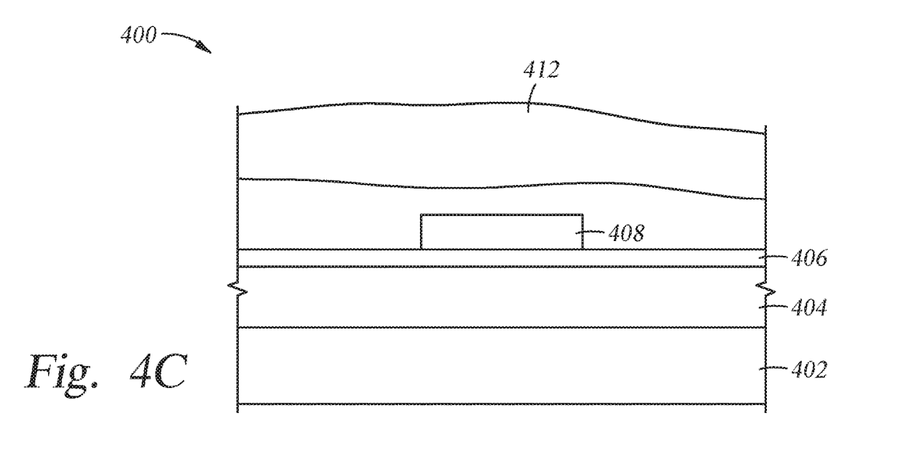

Next, as show in FIG. 4C, the fluorine treated metal oxide layer 408 may be patterned, such as by etching to remove portions of the metal oxide layer 408, to expose portions of the silicon oxide layer 406. Following the etching of the portions of the metal oxide layer 408, the metal oxide layer 408 may be treated again by a fluorine containing gas or plasma 412. The fluorine containing gas or plasma 412 may be the same as the fluorine containing gas or plasma 308 shown in FIG. 3D. The treatment process conditions of the metal oxide layer 408 may be the same as the treatment process conditions of the metal oxide layer 310. An annealing process may be formed on the patterned metal oxide layer 408 prior to the second fluorine containing gas or plasma treatment.

Figure 4D:
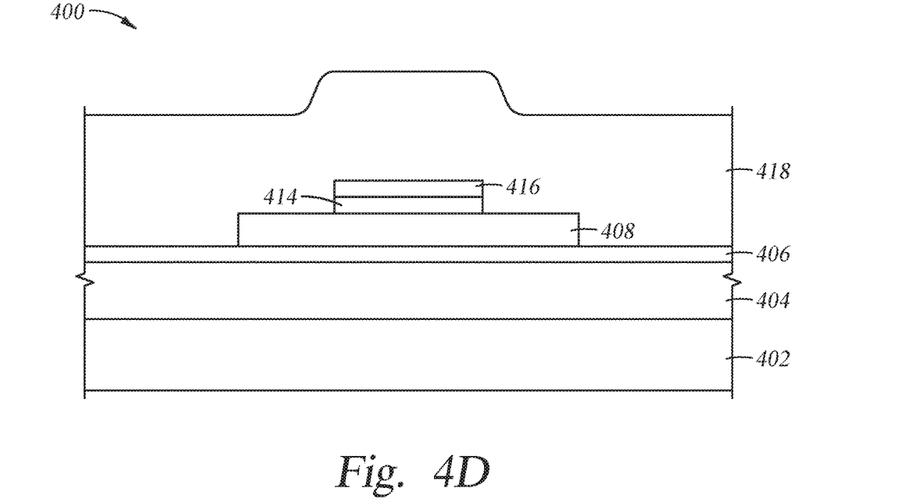

Next, as shown in FIG. 4D, a gate dielectric layer 414 may be deposited on the treated metal oxide layer 408. The gate dielectric layer 414 may be made of the same material as the gate dielectric layer 306. A gate contact layer 416 may be deposited on the gate dielectric layer 414, and the gate contact layer 416 may be made of the same material as the gate electrode 304. The gate dielectric layer 414 and the gate contact layer 416 may be patterned, such as by etching to remove portions of the gate dielectric layer 414 and the gate contact layer 416, to expose portions of the metal oxide layer 408. A inter-layer dielectric (ILD) layer 418 may be deposited on the exposed silicon oxide layer 406, the exposed metal oxide layer 408, and the gate contact layer 416. The ILD layer 418 may be made of any suitable dielectric material, such as silicon oxide.

Figure 4E:
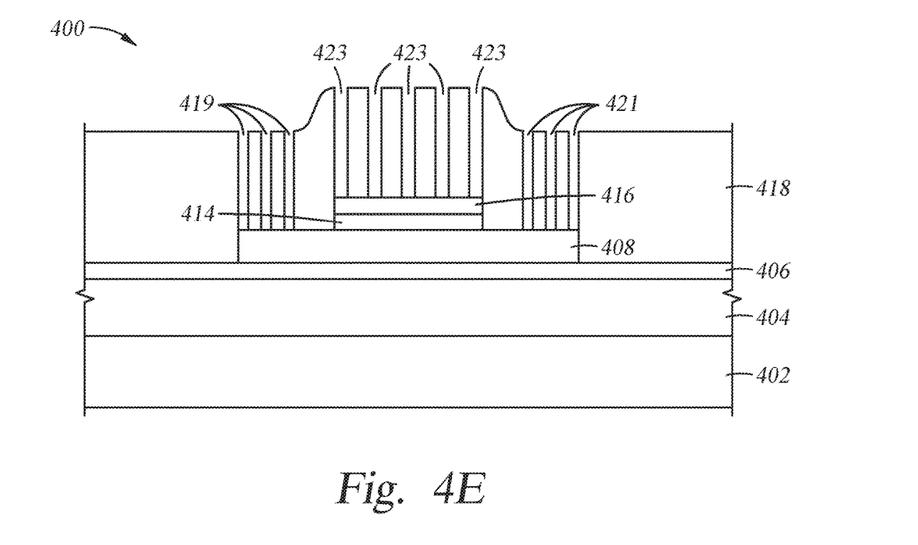
Figure 4F:
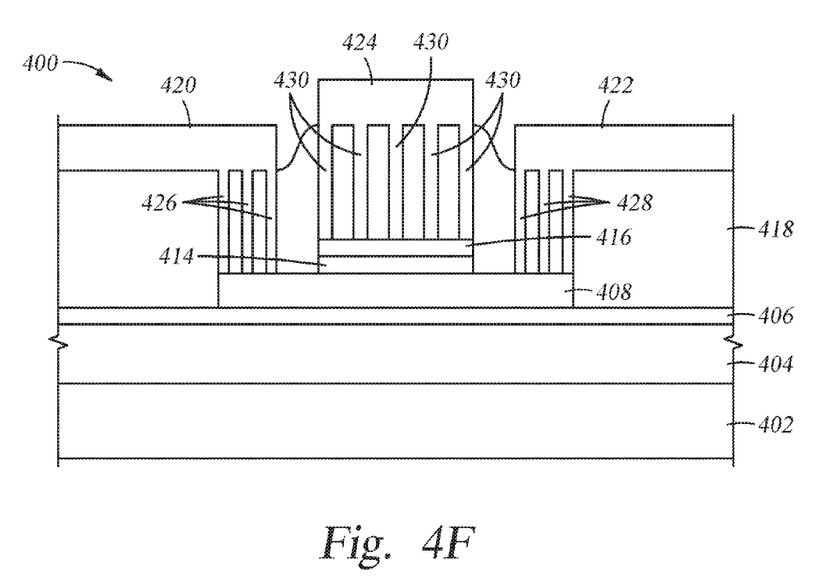

A plurality of contact holes 419, 421, 423 may be formed in the ILD layer 418, as shown in FIG. 4E. The contact holes 419, 421, 423 may be formed by any suitable method, such as etching. Portions of the metal oxide layer 408 may be exposed due to the forming of the plurality of contact holes 419, 421, and portions of the gate contact layer 416 may be exposed due to the forming of the plurality of contact holes 423. The contact holes 419, 421, 423 may be filled with a metal to form contacts 426, 428, 430, respectively, as shown in FIG. 4E. The plurality of contacts 426, 428, 430 may be made of the same material as the gate electrode 304. The plurality of contacts 426, 428 may be in direct contact with the metal oxide layer 408, and the plurality of contacts 430 may be in direct contact with the gate contact layer 416. A metal layer may be deposited on the ILD layer 418, and the metal layer may be patterned to define a source electrode 420, a drain electrode 422, and a gate electrode 424. The source electrode 420, the drain electrode 422, and the gate electrode 424 may be made of the same material as the gate electrode 304. The source electrode 420 may be in direct contact with the plurality of contacts 426, the drain electrode 422 may be in direct contact with the plurality of contacts 428, and the gate electrode 424 may be in direct contact with the plurality of contacts 430. Since the gate electrode 424 is formed over the metal oxide layer 408, the TFT 400 may be a top gate TFT.

Figure 5A:
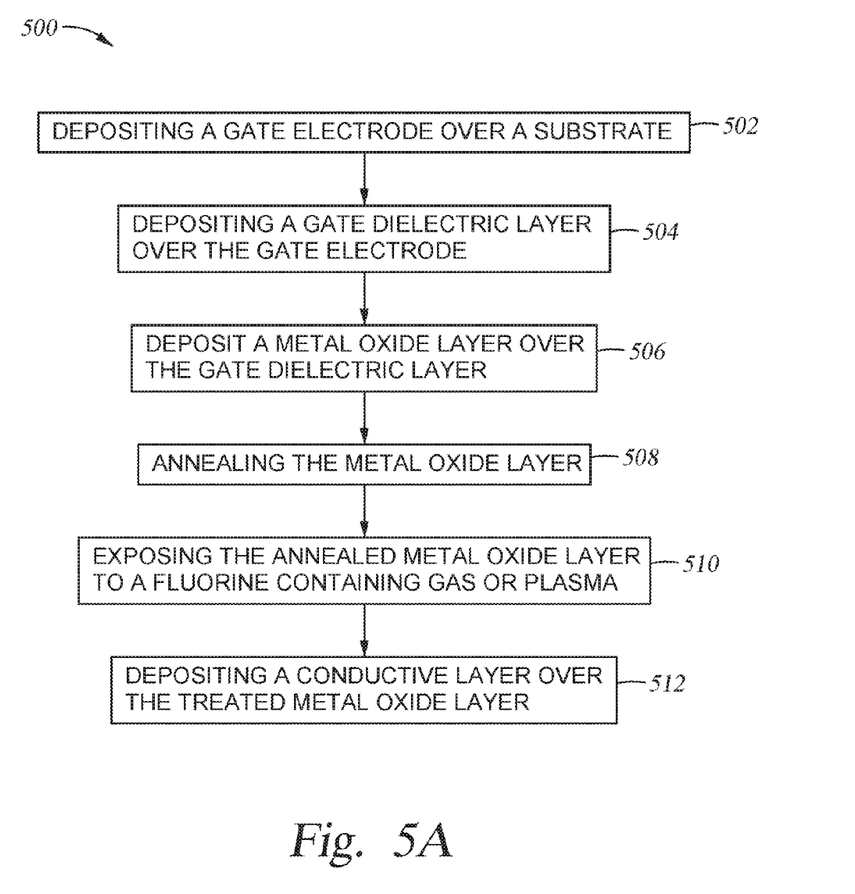
FIGS. 5A-5C are flow charts showing processes for forming the TFT shown in FIGS. 3A-3G according to embodiments disclosed herein.

FIGS. 5A-5C are flow charts showing processes for forming the TFT 300 shown in FIGS. 3A-3G according to embodiments disclosed herein. As shown in FIG. 5A, a process 500 starts with block 502, which is to deposit a gate electrode over a substrate. The gate electrode may be the gate electrode 304 and the substrate may be the substrate 302 shown in FIG. 3A. Next, at block 504, a gate dielectric layer is deposited over the gate electrode. The gate dielectric layer may be the gate dielectric layer 306 shown in FIG. 3B. A metal oxide layer, such as the metal oxide layer 310 shown in FIG. 3C, may be deposited over the gate dielectric layer, as shown at block 506. Following the deposition of the metal oxide layer, the metal oxide layer may be annealed, as shown at block 508. Next, as shown in block 510, the metal oxide layer is exposed to a fluorine containing gas or plasma, such as the fluorine containing gas or plasma 308 as shown in FIG. 3D. Lastly, as shown at block 512, a conductive layer, such as the conductive layer 314, may be deposited over the treated metal oxide layer.

Figure 5B:
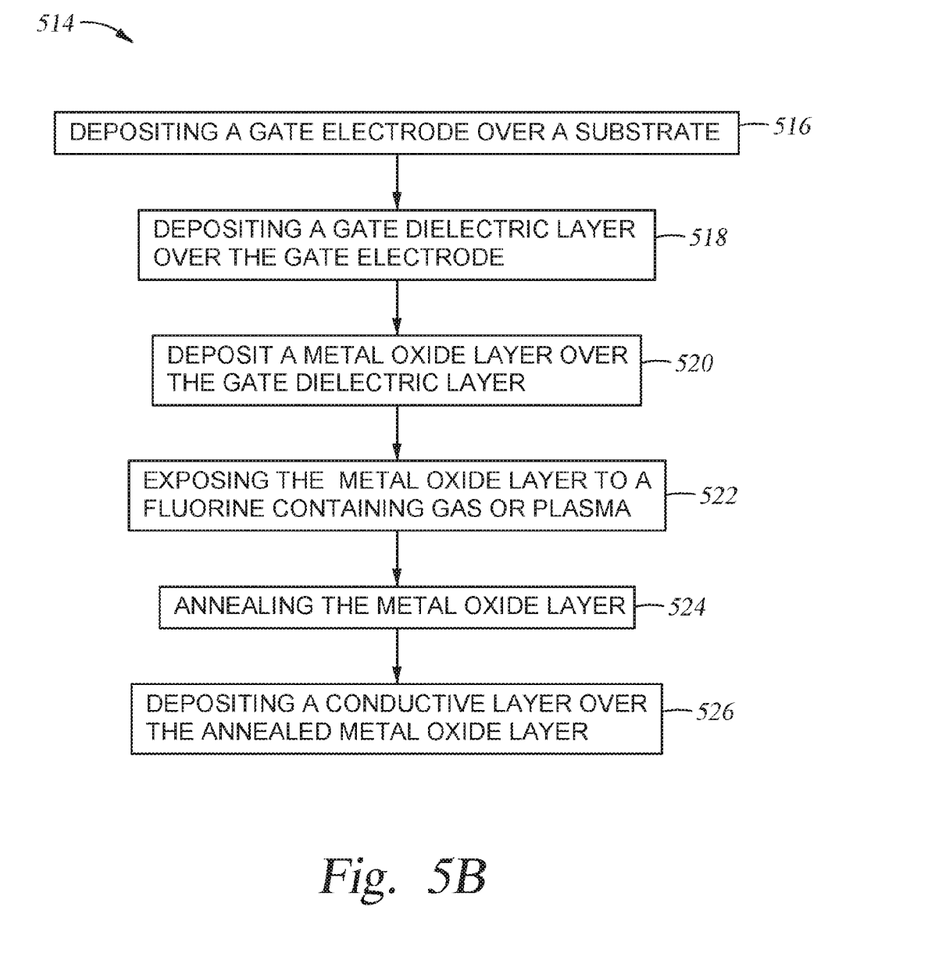

As shown in FIG. 5B, a process 514 starts with block 516, which is to deposit a gate electrode over a substrate. The gate electrode may be the gate electrode 304 and the substrate may be the substrate 302 shown in FIG. 3A. Next, at block 518, a gate dielectric layer is deposited over the gate electrode. The gate dielectric layer may be the gate dielectric layer 306 shown in FIG. 3B. A metal oxide layer, such as the metal oxide layer 310 shown in FIG. 3C, may be deposited over the gate dielectric layer, as shown at block 520. Following the deposition of the metal oxide layer, as shown at block 522, the metal oxide layer may be exposed to a fluorine containing gas or plasma, such as the fluorine containing gas or plasma 308 as shown in FIG. 3D. Next, the treated metal oxide layer may be annealed, as shown at block 524. Lastly, as shown at block 526, a conductive layer, such as the conductive layer 314, may be deposited over the treated and annealed metal oxide layer.

Figure 5C:
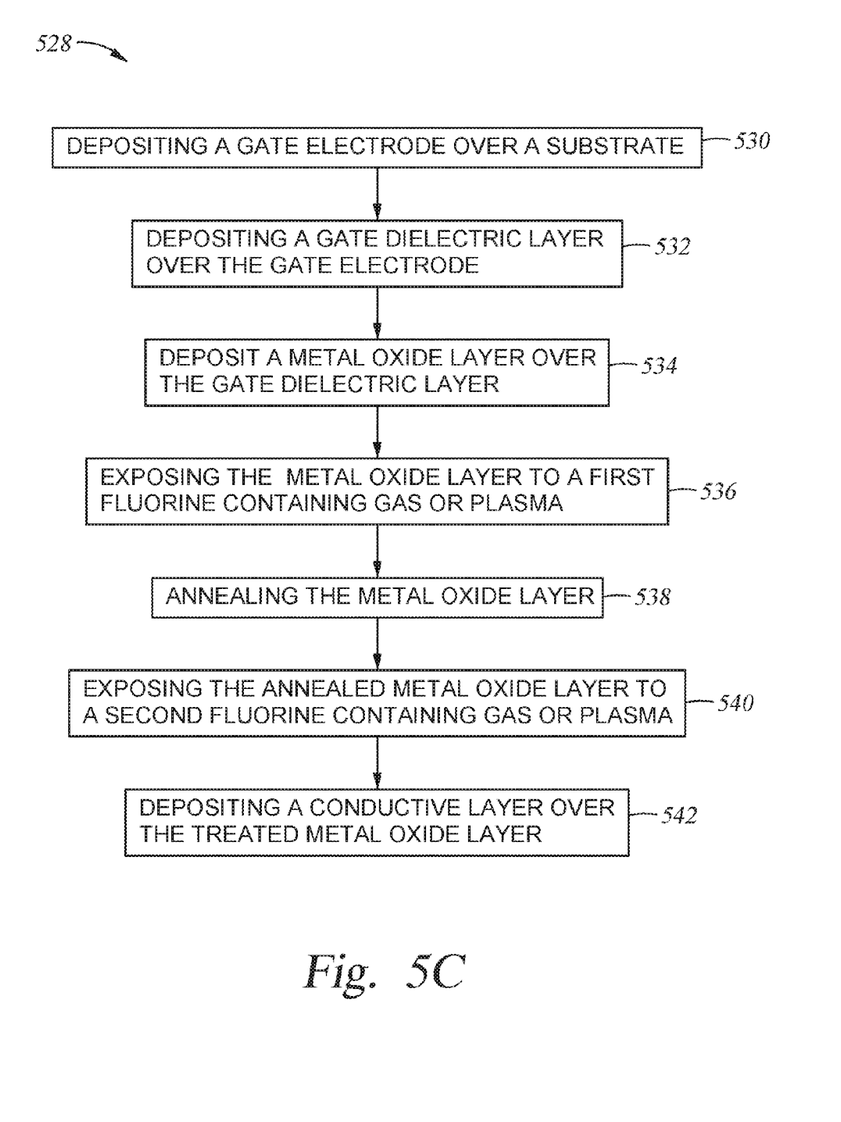

As shown in FIG. 5C, a process 528 starts with block 530, which is to deposit a gate electrode over a substrate. The gate electrode may be the gate electrode 304 and the substrate may be the substrate 302 shown in FIG. 3A. Next, at block 532, a gate dielectric layer is deposited over the gate electrode. The gate dielectric layer may be the gate dielectric layer 306 shown in FIG. 3B. A metal oxide layer, such as the metal oxide layer 310 shown in FIG. 3C, may be deposited over the gate dielectric layer, as shown at block 534. Following the deposition of the metal oxide layer, as shown at block 536, the metal oxide layer may be exposed to a first fluorine containing gas or plasma, such as the fluorine containing gas or plasma 308 as shown in FIG. 3D. Next, the treated metal oxide layer may be annealed, as shown at block 538. Following the annealing of the treated metal oxide layer, as shown at block 540, the annealed metal oxide layer may be again exposed to a second fluorine containing gas or plasma, such as the fluorine containing gas or plasma 308 as shown in FIG. 3D. Lastly, as shown at block 542, a conductive layer, such as the conductive layer 314, may be deposited over the treated metal oxide layer.

In summary, a method for forming a TFT includes treating a metal oxide layer with a fluorine containing gas or plasma. The fluorine containing gas or plasma treatment may be performed prior to, after, or both prior to and after an annealing process performed on the metal oxide layer. The fluorine containing gas or plasma treatment helps fill the oxygen vacancies and passivate the metal oxide layer to prevent the oxygen molecules from leaving the metal oxide layer. Having reduced oxygen vacancies prevents a negative threshold voltage and leads to a more stable TFT.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
    forming a gate electrode over a substrate;
    depositing a gate dielectric layer over the gate electrode;
    depositing a metal oxide semiconductor layer over the gate dielectric layer; then
    annealing the metal oxide semiconductor layer; then
    treating the metal oxide semiconductor layer with first fluorine radicals; and then
    depositing a conductive layer over the metal oxide semiconductor layer.

2. The method of claim 1, wherein the first fluorine radicals are generated in a first remote plasma.

3. The method of claim 1, wherein the first fluorine radicals are generated in a first plasma ignited within a chamber in which the metal oxide semiconductor layer is disposed.

4. The method of claim 1, further comprising treating the metal oxide semiconductor layer with second fluorine radicals prior to annealing the metal oxide semiconductor layer, wherein the second fluorine radicals are generated in a second remote plasma.

5. The method of claim 1, further comprising treating the metal oxide semiconductor layer with second fluorine radicals prior to annealing the metal oxide semiconductor layer, wherein the second fluorine radicals are generated in a second plasma ignited within a chamber in which the metal oxide semiconductor layer is disposed.

6. The method of claim 1, wherein the treating the metal oxide semiconductor layer with fluorine radicals is performed in a physical vapor deposition chamber.

7. The method of claim 1, wherein the treating the metal oxide semiconductor layer with fluorine radicals is performed in a plasma enhanced chemical vapor deposition chamber.

8. A method, comprising:
    forming a gate electrode over a substrate;
    depositing a gate dielectric layer over the gate electrode;
    depositing a metal oxide semiconductor layer over the gate dielectric layer; then
    annealing the metal oxide semiconductor layer; then
    treating the metal oxide semiconductor layer with a fluorine containing gas; and then
    depositing a conductive layer over the metal oxide semiconductor layer.

9. The method of claim 8, wherein the fluorine containing gas comprises $NF_3$, $CF_4$, or $F_2$.

10. A method, comprising:
    forming a gate electrode over a substrate;
    depositing a gate dielectric layer over the gate electrode;
    depositing a metal oxide semiconductor layer over the gate dielectric layer; then
    annealing the metal oxide semiconductor layer; then
    treating the metal oxide semiconductor layer with first fluorine radicals, comprising:
        flowing a fluorine containing gas into a remote plasma source, wherein the fluorine containing gas has a flow rate ranging from about 2000 standard cubic centimeters per minute (sccm) to about 6000 sccm;

forming a fluorine containing plasma that is free of oxygen and silicon in the remote plasma source, wherein the remote plasma source has a power density ranging from about 0.2 W/cm$^2$ to about 0.6 W/cm$^2$; and flowing the fluorine containing plasma into a processing area, wherein the substrate has a temperature ranging from about 150 degrees Celsius to about 350 degrees Celsius; and then depositing a conductive layer over the metal oxide semiconductor layer.

11. The method of claim 10, wherein the fluorine containing gas comprises NF$_3$, CF$_4$, or F$_2$.

12. The method of claim 10, wherein the treating the metal oxide semiconductor layer is performed in a plasma enhanced chemical vapor deposition chamber.

13. The method of claim 12, wherein a pressure inside the plasma enhanced chemical vapor deposition ranges from about 200 mT to about 900 mT.

14. The method of claim 10, wherein the substrate has a temperature of about 350 degrees Celsius during the annealing the metal oxide semiconductor layer.

15. The method of claim 10, wherein the metal oxide semiconductor layer comprises oxygen and one or more elements selected from the group consisting of zinc, gallium, cadmium, indium, tin, and combinations thereof.

16. The method of claim 10, further comprising treating the metal oxide semiconductor layer with second fluorine radicals prior to annealing the metal oxide semiconductor layer, wherein the second fluorine radicals are generated in a second remote plasma.

17. The method of claim 10, wherein the gate electrode comprises aluminum, molybdenum, tungsten, chromium, tantalum, or combinations thereof.

18. The method of claim 10, further comprising forming an etch stop layer on the metal oxide semiconductor layer after treating the metal oxide semiconductor layer, wherein the conductive layer is disposed on the etch stop layer.

19. The method of claim 18, wherein the etch stop layer comprises silicon oxide, aluminum oxide, or silicon nitride.

20. The method of claim 10, further comprising forming a passivation layer on the conductive layer.

* * * * *